US008980681B2

United States Patent
Hsu

(10) Patent No.: US 8,980,681 B2
(45) Date of Patent: Mar. 17, 2015

(54) METHOD FOR FABRICATING SOLAR CELL

(71) Applicant: Industrial Technology Research Institute, Chutung, Hsinchu (TW)

(72) Inventor: Wei-Tse Hsu, Taoyuan (TW)

(73) Assignee: Industrial Technology Research Institute, Hsinchu (TW)

(\*) Notice: Subject to any disclaimer, the term of this patent is extended or adjusted under 35 U.S.C. 154(b) by 0 days.

(21) Appl. No.: 13/929,067

(22) Filed: Jun. 27, 2013

(65) Prior Publication Data
US 2014/0154835 A1 Jun. 5, 2014

(30) Foreign Application Priority Data

Dec. 3, 2012 (TW) ............................ 101145230 A

(51) Int. Cl.
*H01L 21/00* (2006.01)
*H01L 31/18* (2006.01)
*H01L 31/032* (2006.01)
*H01L 31/0749* (2012.01)

(52) U.S. Cl.
CPC ........ *H01L 31/1828* (2013.01); *H01L 31/0322* (2013.01); *H01L 31/0749* (2013.01)
USPC ................. 438/95; 438/93; 438/94; 136/252; 136/260; 136/264

(58) Field of Classification Search
CPC ............ H01L 31/0749; H01L 27/1423; H01L 31/022425; H01L 31/0322; H01L 31/03923; H01L 31/1828; Y02E 10/541
USPC ............... 257/E31.008; 438/93–95; 136/264, 136/252, 260
See application file for complete search history.

(56) References Cited

U.S. PATENT DOCUMENTS 6,518,086 B2\* 2/2003 Beck et al. ...................... 438/95
7,153,761 B1 12/2006 Nastasi et al.
7,638,410 B2 12/2009 Nastasi et al.
(Continued)

FOREIGN PATENT DOCUMENTS

CN 102498576 A 6/2012
TW 201013945 A 4/2010
(Continued)

OTHER PUBLICATIONS

Abe et al., "Transfer of CuInS2 thin film by lift-off process and application to superstrate-type thin-film solar cells", Thin Solid Films, May 3, 2012, vol. 520, pp. 5640-5643.
Abe et al. "Lift-off process reducing crack formation and its Cu(In,Ga)Se-2 thin film solar cell applications", ScienceDirect Solar Energy, May 27, 2011, Vole. 85, pp. 2101-2107.
(Continued)

*Primary Examiner* — Bac Au
(74) *Attorney, Agent, or Firm* — Muncy, Geissler, Olds & Lowe, P.C.

(57) ABSTRACT

The disclosure provides a method for fabricating a solar cell, including: providing a first substrate; forming a light absorption precursor layer on the first substrate; conducting a thermal process to the light absorption precursor layer to form a light absorption layer, wherein the light absorption layer includes a first light absorption layer and a second light absorption layer, and the first absorption layer is formed on the first substrate; forming a second substrate on the second light absorption layer; removing the first substrate to expose a surface of the first light absorption layer; forming a zinc sulfide (ZnS) layer on the surface of the first light absorption layer; and forming a transparent conducting oxide (TCO) layer on the zinc sulfide (ZnS) layer.

18 Claims, 4 Drawing Sheets

(56) References Cited

U.S. PATENT DOCUMENTS

| | | | |
|---|---|---|---|
| 7,713,773 B2 * | 5/2010 | Aksu et al. | 438/57 |
| 8,343,797 B2 * | 1/2013 | Taliani et al. | 438/86 |
| 8,367,925 B2 * | 2/2013 | Ahn | 136/260 |
| 8,680,393 B2 * | 3/2014 | Bojarczuk et al. | 136/265 |
| 2005/0194036 A1 * | 9/2005 | Basol | 136/252 |
| 2007/0277875 A1 * | 12/2007 | Gadkaree et al. | 136/256 |
| 2008/0280030 A1 * | 11/2008 | Van Duren et al. | 427/74 |
| 2010/0248419 A1 * | 9/2010 | Woodruff et al. | 438/95 |
| 2010/0270653 A1 * | 10/2010 | Leitz et al. | 257/618 |
| 2011/0048524 A1 * | 3/2011 | Nam et al. | 136/256 |
| 2014/0144497 A1 * | 5/2014 | Kim et al. | 136/256 |

FOREIGN PATENT DOCUMENTS

| | | |
|---|---|---|
| TW | 201030996 A | 8/2010 |
| TW | 201116648 A1 | 5/2011 |
| TW | 201234391 | 8/2012 |
| WO | WO2012/037391 A2 | 3/2012 |

OTHER PUBLICATIONS

Anegawa et al., "Comparison of lift-off processes and rear-surface characterization of Cu(In,Ga)Se2 thin films for solar cells", Journal of Crystal Growth, 2009, vol. 311, pp. 742-745.

Minemoto et al., "Layer Transfer of Cu(In,Ga)Se2 Thin Film and Solar Cell Fabrication", Japanese Journal of Applied Physics, Jan 20, 2010, vol. 49, pp. 012301-1-012301-4.

Osada et al., "Cu(In,Ga)Se 2 solar cells with superstrate structure using lift-off process", Solar Energy Materials & Solar Cells, 2011, vol. 95, pp. 223-226.

Minemoto et al., "Lift-Off Process for Flexible Cu(In,Ga)Se2 Solar Cells", Japanese Journal of Applied Physics, Apr 20, 2010, vol. 49, pp. 04DP06-1-04DP06-3.

Geisz et al., "High-efficiency GaInP/GaAs/InGaAs triple-junction solar cells grown inverted with a metamorphic bottom junction", Applied Physics Letters, 2007, vol. 91, 4 pages.

Kim, et al., "Grain Growth Enhancement and Ga Distribution of Cu,,In0.7Ga0.3 . . . Se2 Film Using Cu2Se Layer on Cu—In—Ga Metal Precursor", Journal of the Electrochemical Society, Nov 18, 2009, vol. 157, pp. B154-B158.

Taiwanese Office Action dated Dec. 17, 2014, as issued in corresponding Taiwan Patent Application No. 101145230 (7 pages).

* cited by examiner

METHOD FOR FABRICATING SOLAR CELL

CROSS REFERENCE TO RELATED APPLICATIONS

This Application claims priority of Taiwan Patent Application No. 101145230, filed on Dec. 3, 2012, the entirety of which is incorporated by reference herein.

TECHNICAL FIELD

The present disclosure relates to a method for fabricating a solar cell, and in particular, relates to a method for fabricating a zinc sulfide (ZnS) buffer layer on a delaminated light absorption layer.

BACKGROUND

Development in the solar cell industry is driven by global environmental concerns and rising raw material prices. Among the various solar cells developed, CIGS solar cell (Cu(In,Ga)Se$_2$) is advantageous as it can be fabricated with relatively lower costs due to its simpler fabrication process and ability for large area fabrication.

The semiconductor material with chalcopyrite structure mainly consists of the Group IB-IIIA-VIA compound which is a direct bandgap semiconductor material. The electronic and optical properties of the Group IB-IIIA-VIA compound are tunable by adjusting the proportion of its composition so that it can be applied to solar cells.

In prior art, a buffer layer is formed on a light absorption layer. A heterogeneous interface between the buffer layer and the light absorption layer is formed to improve short wavelength light absorption efficiency. Additionally, a non-toxic buffer layer (such as ZnS) is used instead of a toxic CdS buffer layer.

Furthermore, in the conventional fabrication method for the CIGS solar cell, a solution coating method is accompanied with a selenization process. However, due to this, a structural delamination problem occurs. When the ZnS buffer layer is formed on the delaminated light absorption layer, a high fabrication temperature is performed or a post-sulfurization process to the light absorption layer is performed to solve the structural delamination problem. However, for the post-sulfurization process, substrate selectivity is reduced due to the high fabrication temperature and a toxic material H$_2$S is needed.

SUMMARY

The disclosure provides a method for fabricating a solar cell, comprising: providing a first substrate; forming a light absorption precursor layer on the first substrate; conducting a thermal process to the light absorption precursor layer to form a light absorption layer, wherein the light absorption layer comprises a first light absorption layer and a second light absorption layer, and the first absorption layer is formed on the first substrate; forming a second substrate on the second light absorption layer; removing the first substrate to expose a surface of the first light absorption layer; forming a zinc sulfide (ZnS) layer on the surface of the first light absorption layer; and forming a transparent conducting oxide (TCO) layer on the zinc sulfide (ZnS) layer.

A detailed description is given in the following embodiments with reference to the accompanying drawings.

BRIEF DESCRIPTION OF THE DRAWING

The disclosure can be more fully understood by reading the subsequent detailed description and examples with references made to the accompanying drawings, wherein.

DETAILED DESCRIPTION

Figure 1A:
FIG. 1A-1F show cross-sectional schematic representations of various stages of fabricating a solar cell in accordance with an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1A-1F show cross-sectional schematic representations of various stages of fabricating a solar cell in accordance with an embodiment of the disclosure. Firstly, a first substrate 102 is provided, wherein the first substrate 102 comprises glass, polymer substrate, metal substrate or combinations thereof.

Then, referring to FIG. 1A, a light absorption layer 104 is formed on the first substrate 102. The light absorption layer 104 is formed by a spin coating method, bar coating method, dip coating method, roll coating method, spray coating method, gravure coating method, ink jet printing method, slot coating method or blade coating method.

In one embodiment, a light absorption precursor layer is firstly fabricated by dissolving Group IB oxide, Group IIIA oxide and Group VIA oxide in a solution, wherein Group IB comprises copper (Cu), silver (Ag), gold (Au) or combinations thereof, Group IIIA comprises aluminum (Al), indium (In), gallium (Ga) or combinations thereof, Group VIA comprises sulfur (S), selenium (Se), tellurium (Te) or combinations thereof. The solution comprises water, alcohol, ketone or ether. Then, the light absorption precursor layer with a thickness of about 0.1-10 μm is coated on the first substrate 102.

Figure 1B:
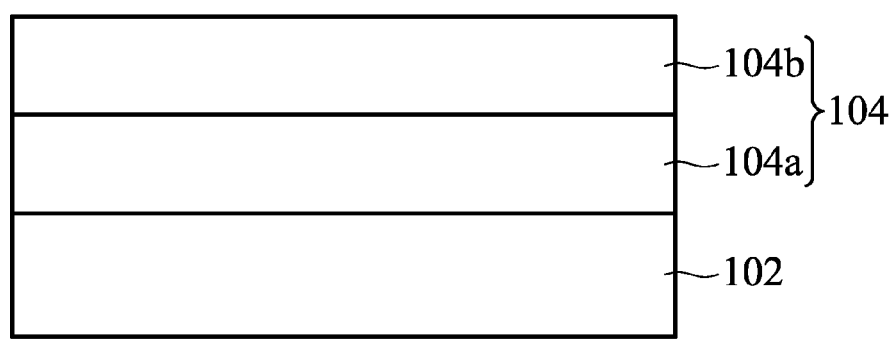

Then, referring to FIG. 1B, a thermal process (including carbon capture process, reduction process and selenization process, etc.) is conducted to the light absorption precursor layer to form a light absorption layer 104. In the selenization process, the reactive rate of every composition of the light absorption precursor layer is different from each other, and a two layered light absorption layer 104 comprising a first light absorption layer 104a and a second light absorption layer 104b, 104b is obtained. The first light absorption layer 104a is formed on the first substrate 102.

In one embodiment, if the light absorption layer 104 comprises a copper indium gallium selenide (CIGS) compound, the first light absorption layer 104a is a copper gallium selenide (CuGaSe$_2$) layer containing gallium-rich layer, and the second light absorption layer 104b is a copper indium selenide (CuInSe$_2$) layer containing indium-rich layer.

The thermal process is conducted by the following steps. The coated first substrate 102 with the light absorption precursor layer is placed in an atmospheric environment containing Group VIA gas to conduct the thermal process. The Group VIA gas comprises hydrogen selenide (H$_2$Se), hydrogen sulfide (HS), selenium (Se) vapor, sulfur (S) vapor, tellurium (Te) vapor or combinations thereof. The thermal process is conducted at a temperature of about 450° C. –550° C. The thermal process is conducted for about 10 minutes-60 minutes.

After the thermal process, because the second light absorption layer 104b contains the indium-rich layer, the particle growth of the second light absorption layer 104b is easier than that of the first light absorption layer 104a. Thus, an average particle size of the second light absorption layer 104b is larger than that of the first light absorption layer 104a. The average particle size of the first light absorption layer 104a is about 50 nm-500 nm, the average particle size of the second light absorption layer 104b is about 1 μm-10 μm, and the average particle size may be affected by the temperature of the thermal process. Additionally, because the second light absorption layer 104b contains the indium-rich layer, an energy gap of the second light absorption layer 104b is smaller than that of the first light absorption layer 104a.

In one embodiment, the first light absorption layer 104a is a copper gallium selenide (CGS) layer having the energy gap of 1.7 eV, and the second light absorption layer 104b is a copper indium selenide (CIS) layer having the energy gap of about 1.0 eV.

Figure 1C:
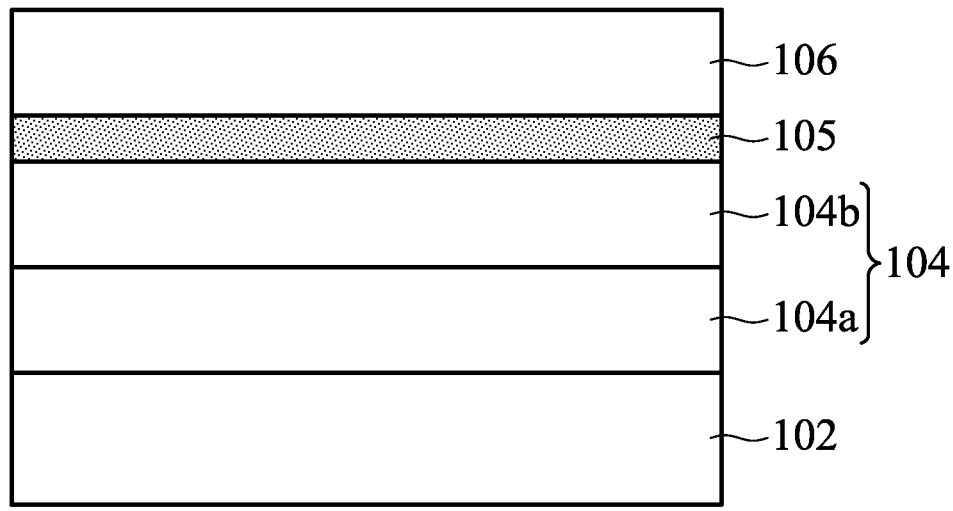

Next, referring to FIG. 1C, a second substrate 106 is formed on the second light absorption layer 104b. The second substrate 106 is formed by coating a conductive glue 105 on the second light absorption layer 104b, and then the second substrate 106 is formed on the conductive glue 105.

The second substrate 106 comprises glass, polymer substrate, metal substrate or combinations thereof. The polymer substrate comprises polyimide (PI), poly(ethylene terephthalate) (PET), poly carbonate (PC), poly(methyl methacrylate) (PMMA) or combinations thereof.

Figure 1D:
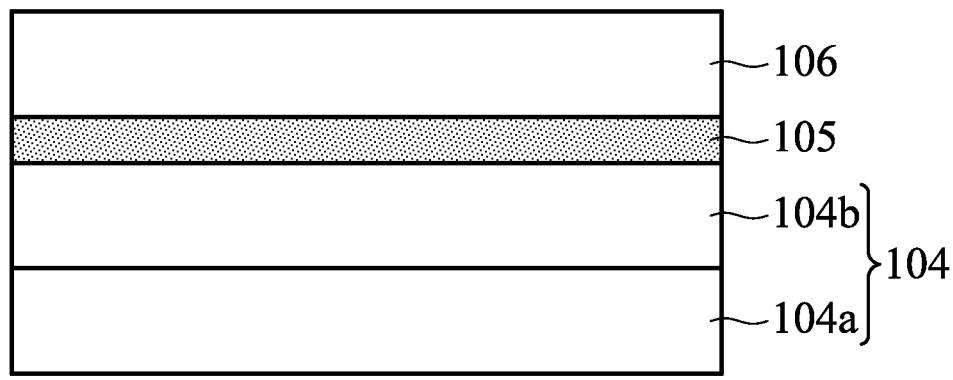

Then, referring to FIG. 1D, the first substrate 102 is removed to expose a surface of the first light absorption layer 104a. Because the material of the second substrate 106 may be flexible, the first substrate 102 may be removed to obtain the light absorption layer 104 by fixing the second substrate 106 on a roll by a roll-to-roll process.

Figure 1E:
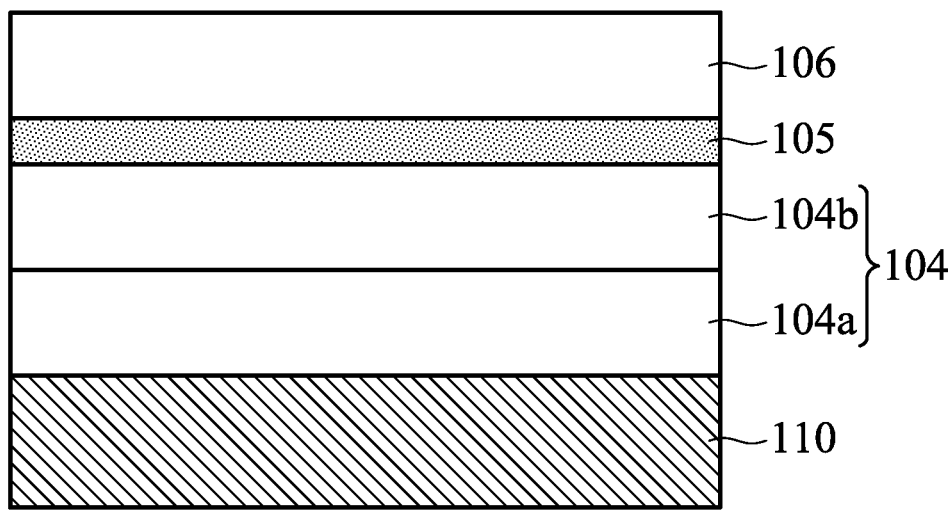

Referring to FIG. 1E, a zinc sulfide (ZnS) layer 110 is formed on the surface of the first light absorption layer 104a. In one embodiment, a portion of the sulfur elements of the zinc sulfide (ZnS) layer 110 is replaced by the oxygen elements. Thus, the zinc sulfide (ZnS) layer 110 further comprises oxygen ($ZnS_{1-x}O_x$, x=0–1).

Figure 1F:
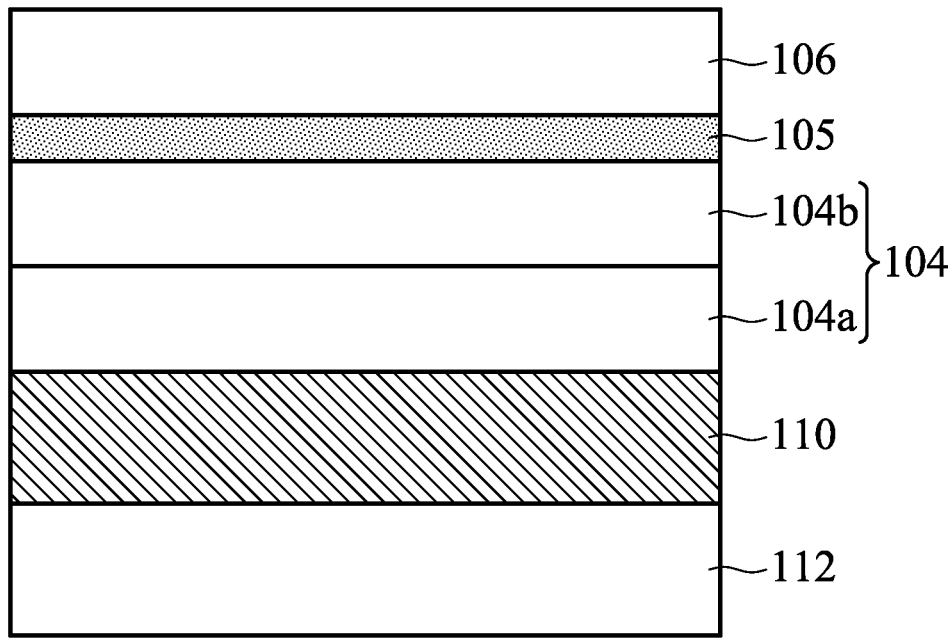

Referring to FIG. 1F, a transparent conducting oxide (TCO) layer 112 is formed on the zinc sulfide (ZnS) layer 110. The transparent conducting oxide (TCO) layer 112 comprises indium tin oxide (ITO), indium oxide ($In_2O_3$), stannum oxide ($SnO_2$), zinc oxide (ZnO), cadmium oxide (CdO), aluminum-doped zinc oxide (AZO), indium zinc oxide (IZO) or combinations thereof.

Note that the temperature of the conventional thermal process must be larger than 600° C. to prevent the structural delamination problem of the light absorption layer, and then the zinc sulfide (ZnS) layer is formed on the light absorption layer. The disclosure provides a method for fabricating a solar cell by forming a reversal structure without high temperature of the thermal process by forming the zinc sulfide (ZnS) layer on the first light absorption layer 104a (such as CGS layer) to improve the structural delamination problem of the light absorption layer. Compared with prior art, the disclosure contains no high temperature thermal process (in the disclosure, the thermal process is conducted at about 450° C.-550° C), the energy gap light absorption layer may be matched with that of the ZnS buffer layer.

Moreover, the energy gap distribution of the solar cell is sequentially decreased from an entrance side of the light to an exit side. The energy gap of the solar cell is decreased with increasing depth of the solar cell. In the Comparative Example, when the ZnS buffer layer 110 is formed on the second light absorption layer 104b (such as CIS layer) with a lower energy gap compared with the first light absorption layer, the photoelectric conversion efficiency of the solar cell of the Comparative Example is extremely low (almost 0%) due to energy gap mismatch problem, which results in difficulties in current output. Thus, a solar cell cannot be obtained when the ZnS buffer layer 110 (energy gap is about 3.6 eV) is formed on the second light absorption layer 104b with a lower energy gap (compared with the first light absorption layer).

From the above description, the disclosure provides a method for fabricating a solar cell by forming a reversal structure to solve the structural delamination problem between the delaminated light absorption layer and the ZnS buffer layer.

EXAMPLE

Example

A stainless steel substrate was used as a first substrate, a Cr layer with a thickness of about 800 nm by a sputter method was formed on the stainless steel substrate, and a Mo layer with a thickness of about 800 nm by a sputter method was formed on the Cr layer.

Then, a CIGS light absorption layer with a thickness of about 2500 nm by a nano-slurry coating method and a thermal process was formed on the Cr layer, wherein the CIGS light absorption layer had a CGS layer with a thickness of about 1500 nm and a CIS layer with a thickness of about 1000 nm.

Next, a silver glue was coated on the CIGS light absorption layer, and a PI (polyimide) substrate was covered on the silver glue and heated to 130° C. for 10 minutes to adhere a PI (polyimide) substrate to the CIGS light absorption layer.

Then, the PI (polyimide) substrate was fixed by a roll, and the stainless steel substrate was removed by scrolling the roll to obtain the CIGS light absorption layer.

Then, a ZnS buffer layer was formed on the CIGS light absorption layer. The ZnS buffer layer was obtained by immersing the CIGS light absorption layer in a solution comprising 0.002 M zinc sulfate, 0.05 M thiourea, and 2.5 M ammonia and reacting the solution at 75° C. for 20 minutes.

A transparent conducting oxide (TCO) layer (comprising an IZO film and an AZO film) was formed on the ZnS buffer layer by a sputter method, and a silver electrode (as upper electrode) was formed on the transparent conducting oxide (TCO) layer by a screen printing method.

The solar cell of the Example was obtained by the above steps and a photoelectric conversion efficiency of the solar cell of the Example was determined at AM 1.5 solar irradiance and illumination with 100 mW/cm².

As shown in Table 1, the solar cell of the Example had an open-circuit voltage ($V_{oc}$) of 0.35 V, a short-circuit current ($J_{sc}$) of 14.06 mA/cm², a fill factor of 28.2% and photoelectric conversion efficiency of 1.578%, a shunt resistance ($R_{sh}$) of 72.72 Ohm and a series resistance ($R_s$) of 48.97 Ohm.

TABLE 1

| $V_{oc}$ | $J_{sc}$ (mA/cm²) | F.F. | photoelectric conversion efficiency | $R_{sh}$ (Ohm) | $R_s$ (Ohm) |
| --- | --- | --- | --- | --- | --- |
| 0.35 V | 14.06 | 28.2% | 1.578% | 72.72 | 48.97 |

In the solar cell of the Example, the CIS layer (the second light absorption layer) had a thickness of about 1000 nm, the CGS layer (the first light absorption layer) had a thickness of about 1500 nm, the ZnS buffer layer had a thickness of about 10-20 nm, the IZO layer had a thickness of about 50 nm and the AZO layer had a thickness of about 400 nm.

Figure 2:
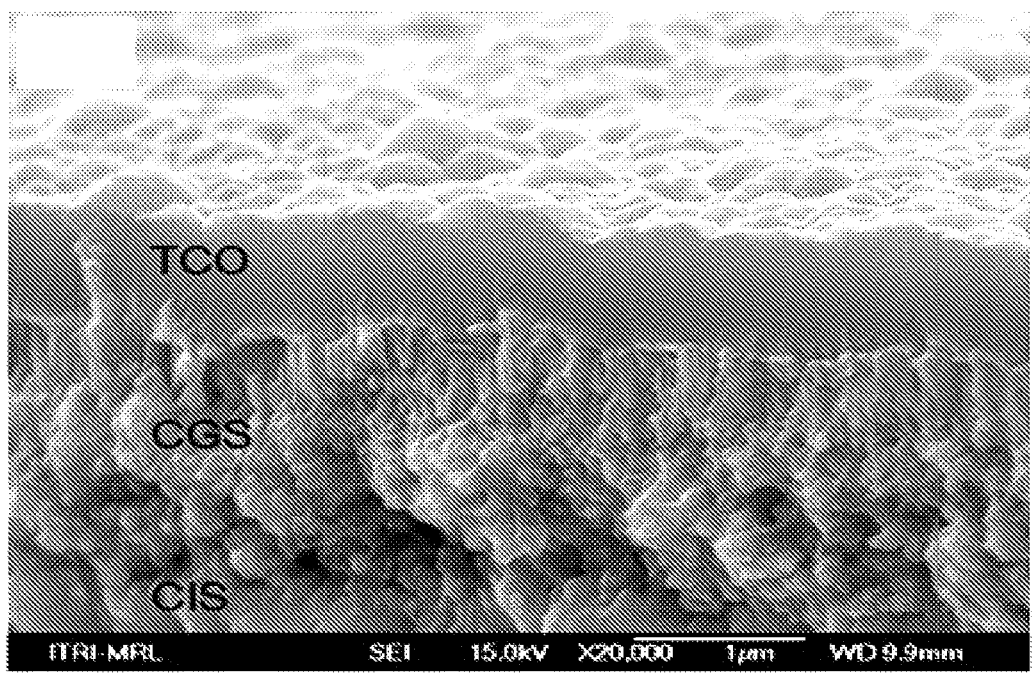
FIG. 2 shows a scanning electron microscopy image (SEM) of the solar cell of the Example.

FIG. 2 shows a scanning electron microscopy image (SEM) of the solar cell of the Example. As shown in FIG. 2, no obvious ZnS buffer layer and IZO layer were observed because the ZnS buffer layer and IZO layer were too thin. Additionally, as shown in FIG. 2, the bonding interfaces between the CGS layer (the first light absorption layer), ZnS buffer layer and transparent conducting oxide (TCO) layer were inseparable and no peeling occurred in the layers. Therefore, the solar cell of the disclosure fabricated by the above steps indeed had excellent properties.

Comparative Example

A stainless steel substrate was used as a first substrate, a Cr layer with a thickness of about 800 nm by a sputter method was formed on the stainless steel substrate, and a Mo layer with a thickness of about 800 nm by a sputter method was formed on the Cr layer.

Then, a CIGS light absorption layer with a thickness of about 2500 nm by a nano-slurry coating method and a thermal process was formed on the Cr layer, wherein the CIGS light absorption layer had a CIS layer (the second light absorption layer) with a thickness of about 1000 nm and a CGS layer (the first light absorption layer) with a thickness of about 1500 nm. Then, a ZnS buffer layer was formed on the CIS layer. The ZnS buffer layer was the same with that of Example.

An transparent conducting oxide (TCO) layer (comprising IZO and an AZO film) was formed on the ZnS buffer layer by a sputter method, and a silver electrode (as upper electrode) was formed on the transparent conducting oxide (TCO) layer by a screen printing method.

The photoelectric conversion efficiency of Comparative Example was 0%. Thus, a solar cell was not obtained when the ZnS buffer layer was formed on the second light absorption layer (CIS layer) with a lower energy gap (compared with the first light absorption layer).

It will be apparent to those skilled in the art that various modifications and variations can be made to the disclosed methods and materials. It is intended that the specification and examples be considered as exemplary only, with a true scope of the disclosure being indicated by the following claims and their equivalents.

What is claimed is:

1. A method for fabricating a solar cell, comprising:
providing a first substrate;
forming a single-layered light absorption precursor layer on the first substrate;
conducting a thermal process to the light absorption precursor layer to form a light absorption layer, wherein the light absorption layer comprises a first light absorption layer and a second light absorption layer, and the first absorption layer is formed on the first substrate;
forming a second substrate on the second light absorption layer;
removing the first substrate to expose a surface of the first light absorption layer;
forming a zinc sulfide (ZnS) layer on the surface of the first light absorption layer; and
forming a transparent conducting oxide (TCO) layer on the zinc sulfide (ZnS) layer.

2. The method for fabricating a solar cell as claimed in claim 1, wherein the light absorption layer comprises a copper indium gallium selenide (CMS) compound.

3. The method for fabricating a solar cell as claimed in claim 1, wherein the first light absorption layer comprises a copper gallium selenide (CGS) layer containing gallium-rich layer, and the second light absorption layer comprises a copper indium selenide (CIS) layer containing indium-rich layer.

4. The method for fabricating a. solar cell as claimed in claim 1, wherein the first substrate comprises glass, polymer substrate, metal substrate or combinations thereof.

5. The method for fabricating a solar cell as claimed in claim 1, wherein forming the light absorption layer comprises a spin coating method, bar coating method, dip coating method, roll coating method, spray coating method, gravure coating method, ink jet printing method, slot coating method or blade coating method.

6. The method for fabricating a solar cell as claimed in claim 1, wherein conducting the thermal process comprises:
placing the first substrate in an atmospheric environment containing Group VIA gas to conduct the thermal process.

7. The method for fabricating a solar cell as claimed in claim 6, wherein the Group VIA gas comprises hydrogen selenide ($H_2Se$), hydrogen sulfide ($H_2S$), selenium (Se) vapor, sulfur (S) vapor, tellurium (Te) vapor or combinations thereof.

8. The method for fabricating a solar cell as claimed in claim 1, wherein the thermal process is conducted at a temperature of about 450° C-550° C.

9. The method for fabricating a solar cell as claimed in claim 1, wherein the ermal process is conducted for about 10 minutes-60 minutes.

10. The method for fabricating a solar cell as claimed in claim 1, wherein an average particle size of the second light absorption layer is larger than that of the first light absorption layer.

11. The method for fabricating a solar cell as claimed in claim 1, wherein an average particle size of the first light absorption layer is about 50 nm-500 nm.

12. The method for fabricating a solar cell as claimed in claim 1, wherein an average particle size of the second light absorption layer is about 1 mm-10 mm.

13. The method for fabricating a solar cell as claimed in claim 1, wherein an energy gap of the second light absorption layer is smaller than that of the first light absorption layer.

14. The method for fabricating a solar cell as claimed in claim 1, wherein the zinc sulfide (ZnS) layer further comprises oxygen ($ZnS_{1-x}O_x$, x=0-1).

15. The method for fabricating a solar cell as claimed in claim 1, wherein the second substrate comprises glass, polymer substrate, metal substrate or combinations thereof.

16. The method for fabricating a solar cell as claimed in claim 15, wherein the polymer substrate comprises polyimide (PI), polyethylene terephthalate (PET), poly carbonate (PC), poiy(methyl methacrylate) (PMMA) or combinations thereof.

17. The method for fabricating a solar cell as claimed in claim 1, wherein the transparent conducting oxide (TCO) layer comprises indium tin oxide (ITO), indium oxide ($In_2O_3$), stannum oxide ($SnO_2$), zinc oxide (ZnO), cadmium oxide(CdO), aluminum-doped zinc oxide (AZO), indium zinc oxide (IZO) or combinations thereof.

18. The method for fabricating a solar cell as claimed in claim 1, wherein forming the second substrate on the second light absorption layer comprises:
coating a conductive glue on the second light absorption layer; and
forming the second substrate on the conductive glue.

* * * * *